(12) United States Patent
Huang et al.

(10) Patent No.: US 12,211,554 B2
(45) Date of Patent: *Jan. 28, 2025

(54) MEMORY DEVICE AND PROGRAM OPERATION THEREOF

(71) Applicant: YANGTZE MEMORY TECHNOLOGIES CO., LTD., Wuhan (CN)

(72) Inventors: Kaijin Huang, Wuhan (CN); Jin Lyu, Wuhan (CN); Gang Liu, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 212 days.

This patent is subject to a terminal disclaimer.

(21) Appl. No.: 17/967,509

(22) Filed: Oct. 17, 2022

(65) Prior Publication Data
US 2023/0035225 A1    Feb. 2, 2023

Related U.S. Application Data

(63) Continuation of application No. 17/307,889, filed on May 4, 2021, now Pat. No. 11,508,441, which is a (Continued)

(30) Foreign Application Priority Data

Mar. 23, 2020    (WO) ................ PCT/CN2020/080636

(51) Int. Cl.
*G11C 16/10*    (2006.01)
*G11C 7/04*    (2006.01)
(Continued)

(52) U.S. Cl.
CPC ............. *G11C 16/102* (2013.01); *G11C 7/04* (2013.01); *G11C 16/08* (2013.01); *G11C 16/24* (2013.01);
(Continued)

(58) Field of Classification Search
CPC ......... G11C 16/102; G11C 7/04; G11C 16/08; G11C 16/24; G11C 16/28; G11C 16/30; (Continued)

(56) References Cited

U.S. PATENT DOCUMENTS

2011/0305088 A1    12/2011    Huang et al.
2014/0334230 A1    11/2014    Kwon
(Continued)

FOREIGN PATENT DOCUMENTS

CN    1906700 A    1/2007
CN    101727977 A    6/2010
(Continued)

OTHER PUBLICATIONS

1st Office action issued in corresponding Chinese Application No. 20208000661.8, mailed on Oct. 27, 2020, 9 pages.
(Continued)

*Primary Examiner* — Michael T Tran
(74) *Attorney, Agent, or Firm* — BAYES PLLC

(57) ABSTRACT

A memory device, a system, and a method for operating the memory device are provided. The memory device includes a first memory string and a peripheral circuit. The first memory string includes a first drain, a first drain select gate (DSG) transistor, a first drain dummy transistor between the first drain and the first DSG transistor, and a plurality of first memory cells. A first drain dummy line is coupled to the first drain dummy transistor, and a first DSG line is coupled to the first DSG transistor. The peripheral circuit is configured to, in a program operation, apply a first DSG voltage to the first DSG line and apply a first drain dummy line voltage to the first drain dummy line to turn on the first drain dummy transistor. The first drain dummy line voltage is greater than the first DSG voltage.

20 Claims, 12 Drawing Sheets

Related U.S. Application Data continuation of application No. PCT/CN2021/082083, filed on Mar. 22, 2021.

(51) Int. Cl.
  *G11C 16/08* (2006.01)
  *G11C 16/24* (2006.01)
  *G11C 16/28* (2006.01)
  *G11C 16/30* (2006.01)
  *G11C 16/34* (2006.01)

(52) U.S. Cl.
  CPC .............. *G11C 16/28* (2013.01); *G11C 16/30* (2013.01); *G11C 16/3404* (2013.01)

(58) Field of Classification Search
  CPC ......... G11C 16/3404; G11C 7/14; G11C 8/14; G11C 16/3427; G11C 16/10; G11C 16/0483; G11C 16/12; G11C 16/14
  USPC .......................................... 365/185.24, 185.2
  See application file for complete search history.

(56) References Cited

U.S. PATENT DOCUMENTS

| | | |
|---|---|---|
| 2015/0294726 A1 | 10/2015 | Sim et al. |
| 2016/0071591 A1 | 3/2016 | Hsu |
| 2016/0217865 A1 | 7/2016 | Chen et al. |
| 2019/0108883 A1 | 4/2019 | Yu et al. |
| 2019/0244673 A1 | 8/2019 | Yang et al. |
| 2020/0202940 A1 | 6/2020 | Park |
| 2020/0265893 A1 | 8/2020 | Park |
| 2021/0295926 A1* | 9/2021 | Huang .................... G11C 16/10 |
| 2022/0013176 A1* | 1/2022 | Du ......................... G11C 16/10 |
| 2023/0132781 A1* | 5/2023 | Liu ....................... G11C 16/102 |
| | | 365/185.22 |
| 2023/0343398 A1* | 10/2023 | Dong .................... G11C 16/10 |
| 2023/0367410 A1* | 11/2023 | Kim .................... G06F 3/04164 |
| 2023/0386580 A1* | 11/2023 | Wang ................. G11C 16/3427 |
| 2023/0386600 A1* | 11/2023 | Lee ........................ G11C 29/52 |

FOREIGN PATENT DOCUMENTS

| | | |
|---|---|---|
| CN | 104143358 A | 11/2014 |
| CN | 103377701 A | 4/2016 |
| CN | 107393588 A | 11/2017 |
| CN | 108028070 A | 5/2018 |
| CN | 108038070 A | 5/2018 |
| CN | 108962912 A | 12/2018 |
| CN | 109308929 A | 2/2019 |
| CN | 110622249 A | 12/2019 |
| CN | 110770836 A | 2/2020 |

OTHER PUBLICATIONS

International Search Report issued in corresponding International Application No. PCT/CN2021/082083, mailed Jun. 25, 2021, 4 pages.

Chinese Office action issued in corresponding Chinese Application No. 202180000854.8, mailed May 7, 2022, 7 pages.

\* cited by examiner

SEL BL
822

SEL D Dummy
801

$V_{dmy\_d} > V_{dsg}$

DSG Line
816

$V_{dsg}$

Upper Dummy WLs
806

$V_{dmy\_wl\_j}$

UNSEL WLs
802

$V_{pass}$

SEL WL
820

$V_{program}$

SSG Line
812

MEMORY DEVICE AND PROGRAM OPERATION THEREOF

CROSS-REFERENCE TO RELATED APPLICATIONS

This application is a continuation of U.S. patent application Ser. No. 17/307,889, filed on May 4, 2021 and granted as U.S. Pat. No. 11,508,441, which is a continuation of International Application No. PCT/CN2021/082083, filed on Mar. 22, 2021, entitled "MEMORY DEVICE AND PROGRAM OPERATION THEREOF," both of which are hereby incorporated by reference in their entireties. This application also claims the benefit of priorities to International Application No. PCT/CN2020/080636, filed on Mar. 23, 2020, entitled "OPERATION METHOD FOR 3D NAND FLASH AND 3D NAND FLASH," which is incorporated herein by reference in its entirety.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, a program operation can be performed at the page level, and a read operation can be performed at the cell level.

SUMMARY

In one aspect, a memory device includes a first memory string including a first drain, a first drain select gate (DSG) transistor, a plurality of first memory cells, and a first drain dummy transistor between the first drain and the first DSG transistor. The memory device also includes a first bit line coupled to the first drain, a first drain dummy line coupled to the first drain dummy transistor, a first DSG line coupled to the first DSG transistor, a plurality of word lines respectively coupled to the first memory cells, and a peripheral circuit configured to perform a program operation on a target memory cell of the first memory cells coupled to a selected word line of the word lines. To perform the program operation, the peripheral circuit includes a bit line driver coupled to the first bit line and configured to apply a first bit line voltage to select the first bit line, and a word line driver coupled to the first drain dummy line and the first DSG line and configured to apply a DSG voltage to the first DSG line to turn on the first DSG transistor, and apply a drain dummy line voltage to the first drain dummy line to turn on the first drain dummy transistor. The drain dummy line voltage is greater than the DSG voltage.

In another aspect, a system includes a memory device configured to store data and a memory controller coupled to the memory device and configured to control the memory device. The memory device includes a first memory string including a first drain, a first DSG transistor, a plurality of first memory cells, and a first drain dummy transistor between the first drain and the first DSG transistor. The memory device also includes a first bit line coupled to the first drain, a first drain dummy line coupled to the first drain dummy transistor, a first DSG line coupled to the first DSG transistor, a plurality of word lines respectively coupled to the first memory cells, and a peripheral circuit configured to perform a program operation on a target memory cell of the first memory cells coupled to a selected word line of the word lines. To perform the program operation, the peripheral circuit includes a bit line driver coupled to the first bit line and configured to apply a first bit line voltage to select the first bit line, and a word line driver coupled to the first drain dummy line and the first DSG line and configured to apply a DSG voltage to the first DSG line to turn on the first DSG transistor, and apply a drain dummy line voltage to the first drain dummy line to turn on the first drain dummy transistor. The drain dummy line voltage is greater than the DSG voltage.

In still another aspect, a method for operating a memory device is provided. The memory device includes a first memory string including a first drain, a first DSG transistor, a plurality of first memory cells, and a first drain dummy transistor between the first drain and the first DSG transistor; a first bit line coupled to the first drain; a first drain dummy line coupled to the first drain dummy transistor; a first DSG line coupled to the first DSG transistor; and a plurality of word lines respectively coupled to the first memory cells. A program operation is performed on a target memory cell of the first memory cells coupled to a selected word line of the word lines. To perform the program operation, a first bit line voltage is applied to select the first bit line, a DSG voltage is applied to the first DSG line to turn on the first DSG transistor, and a drain dummy line voltage is applied to the first drain dummy line to turn on the first drain dummy transistor. The drain dummy line voltage is greater than the DSG voltage.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
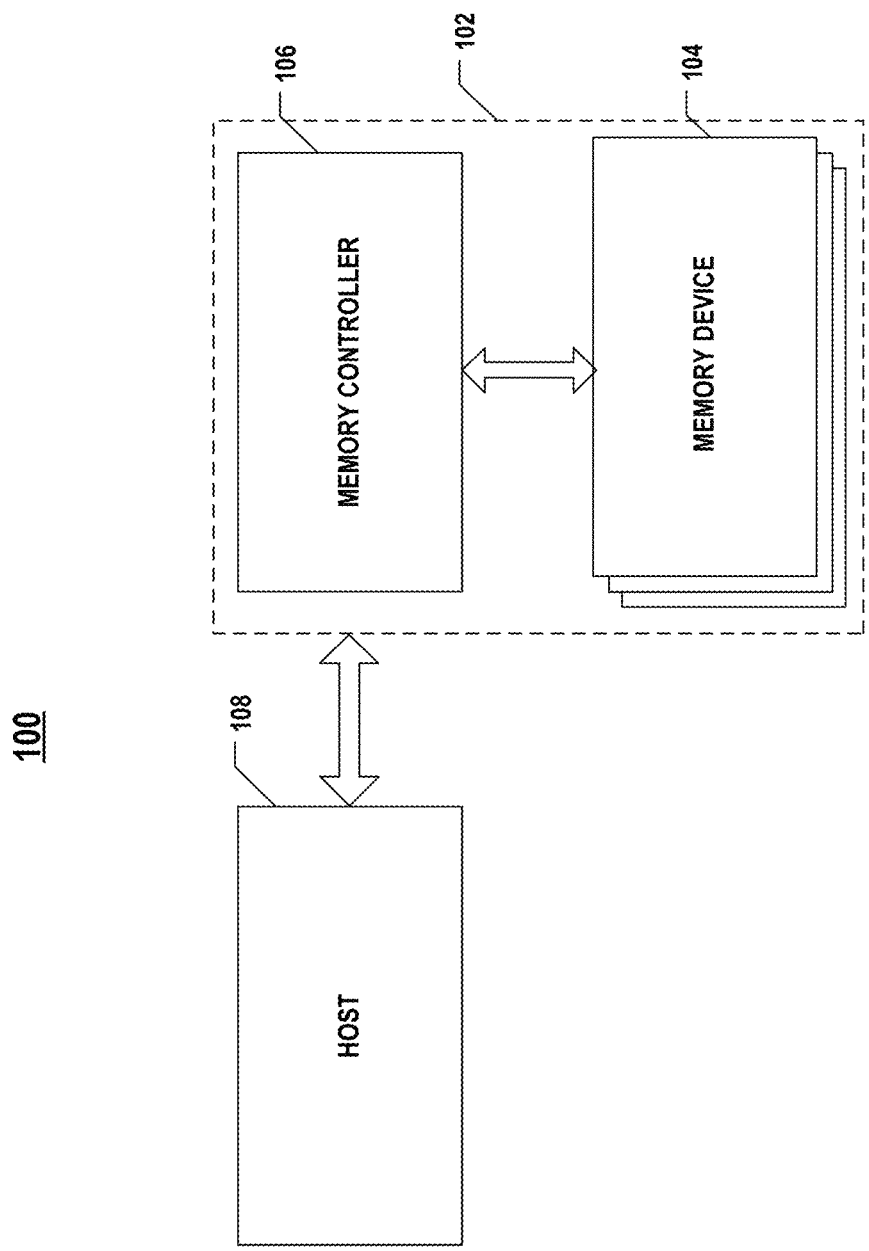
FIG. 1 illustrates a block diagram of an exemplary system having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

NAND Flash memory devices can perform erase operations at the page/word line level, i.e., programming all the memory cells coupled to the same selected word line at the same time. During a program operation, in order to select certain memory cells in the selected word lines to be programmed, drain select gate (DSG) transistors and source select gate (SSG) transistors at the drain and source ends of each NAND memory string can be turned on or off. For a selected NAND memory string, the DSG transistor needs to be fully turned on to increase the programming efficiency. Whereas for an unselected NAND memory string, the DSG transistor needs to be completely turned off in order to form a channel coping potential in the unselected NAND memory string to reduce the program voltage disturbance caused by leakage current from the DSG transistor.

For three-dimensional (3D) NAND memory devices, one or more DSG transistors are usually formed as parts of the top conductive layers in the memory stacks, and the threshold voltages of the DSG transistors are trimmed (e.g., through program operations and/or erase operations) to a desired value or a range. However, due to the nature of the fabrication process in forming the memory stack, the DSG transistor in the top conductive layer has an inferior subthreshold slope (e.g., less steep slope) and high leakage current, thereby reducing the channel coupling potential in the unselected NAND memory string and increasing the program voltage disturbance. Moreover, the DSG transistor in the top conductive layer has inferior temperature characteristics. For example, the threshold voltage of the DSG transistor may increase as the operating temperature decreases, and the threshold voltage uniformity among different DSG transistors may also reduce. As a result, DSG transistors of some selected NAND memory strings may not be fully turned on at low temperatures, which then requires higher program voltage and/or more program voltage pulses, thereby increasing the program voltage disturbance as well as channel pass voltage disturbance.

To address the aforementioned issues, the present disclosure introduces a solution that avoids using the top conductive layer in the memory stack to form the DSG transistors of 3D NAND memory strings. Consistent with scope of the present disclosure, the transistors in the top conductive layer in the memory stack become dummy transistors, and the DSG transistors are formed in the conductive layers that are below the top conductive layer, which have better subthreshold slope and temperature characteristics than the top conductive layer. During program operations, a positive bias gate voltage, which is high enough to ensure that the dummy transistors can be fully turned on even at the low temperatures, is applied to the dummy transistors in the selected NAND memory strings, according to some aspects of the present disclosure.

As a result, the DSG transistors can have a better subthreshold slope and a lower leakage current, thereby reducing the program voltage disturbance for the unselected NAND memory strings. Also, due to the better temperature characteristics, the increase of the DSG transistors' threshold voltages at low temperatures can be reduced and become more uniform among different NAND memory springs, which help to fully turn on all the DSG transistors in selected NAND memory strings during operate operation. Thus, the program operation can be speed up with a smaller number of program voltage pulses and a lower program voltage level, thereby reducing the program voltage disturbance and channel pass voltage disturbance. Moreover, the threshold voltage window of the DSG transistors can be enlarged due to the better subthreshold slope and temperature characteristics, compared with the known NAND memory devices in which the DSG transistors are formed in the top conductive layer of the memory stacks.

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104.

Memory device 104 can be any memory device disclosed in the present disclosure. As disclosed below in detail, memory device 104, such as a NAND Flash memory device, can include a dummy transistor (drain dummy transistor) between the DSG transistor and the drain of each NAND memory string to avoid using such a transistor as the DSG transistor. For example, in a 3D NAND memory device, the top conductive layer of the memory stack may not be used to form the DSG transistor due to its inferior subthreshold slope (e.g., less steep slope) and temperature characteristics.

Consistent with the scope the present disclosure, in a program operation, a drain dummy line voltage that is greater than the DSG voltage can be applied to the drain dummy line to fully turn on the drain dummy transistor in each selected NAND memory string, even at the lower bound of the operating temperature range of memory device 104.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
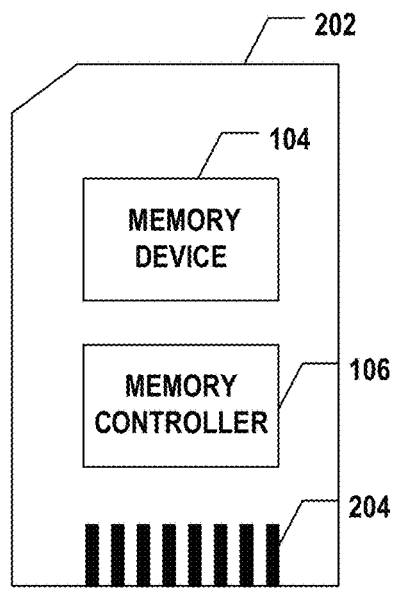
FIG. 2A illustrates a diagram of an exemplary memory card having a memory device, according to some aspects of the present disclosure.
Figure 2B:
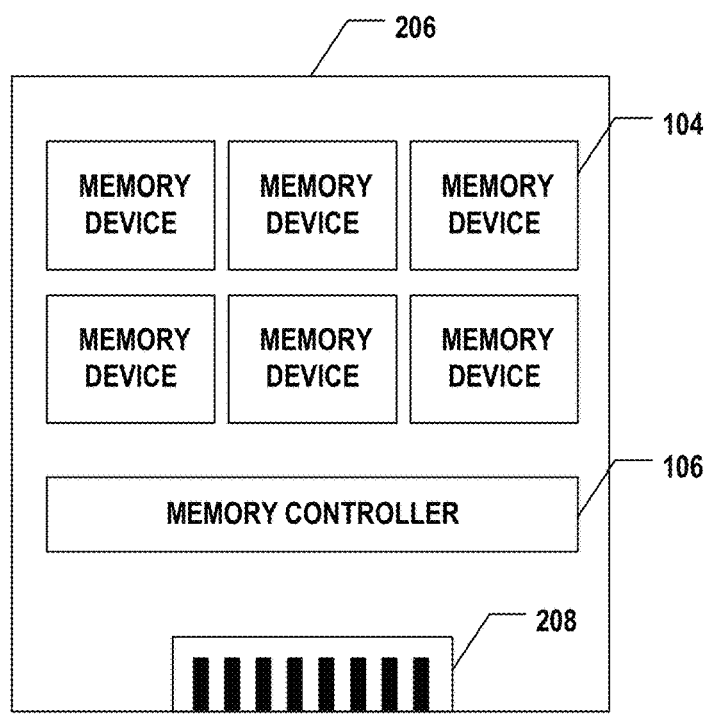
FIG. 2B illustrates a diagram of an exemplary solid-state drive (SSD) having a memory device, according to some aspects of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202.

Figure 3:
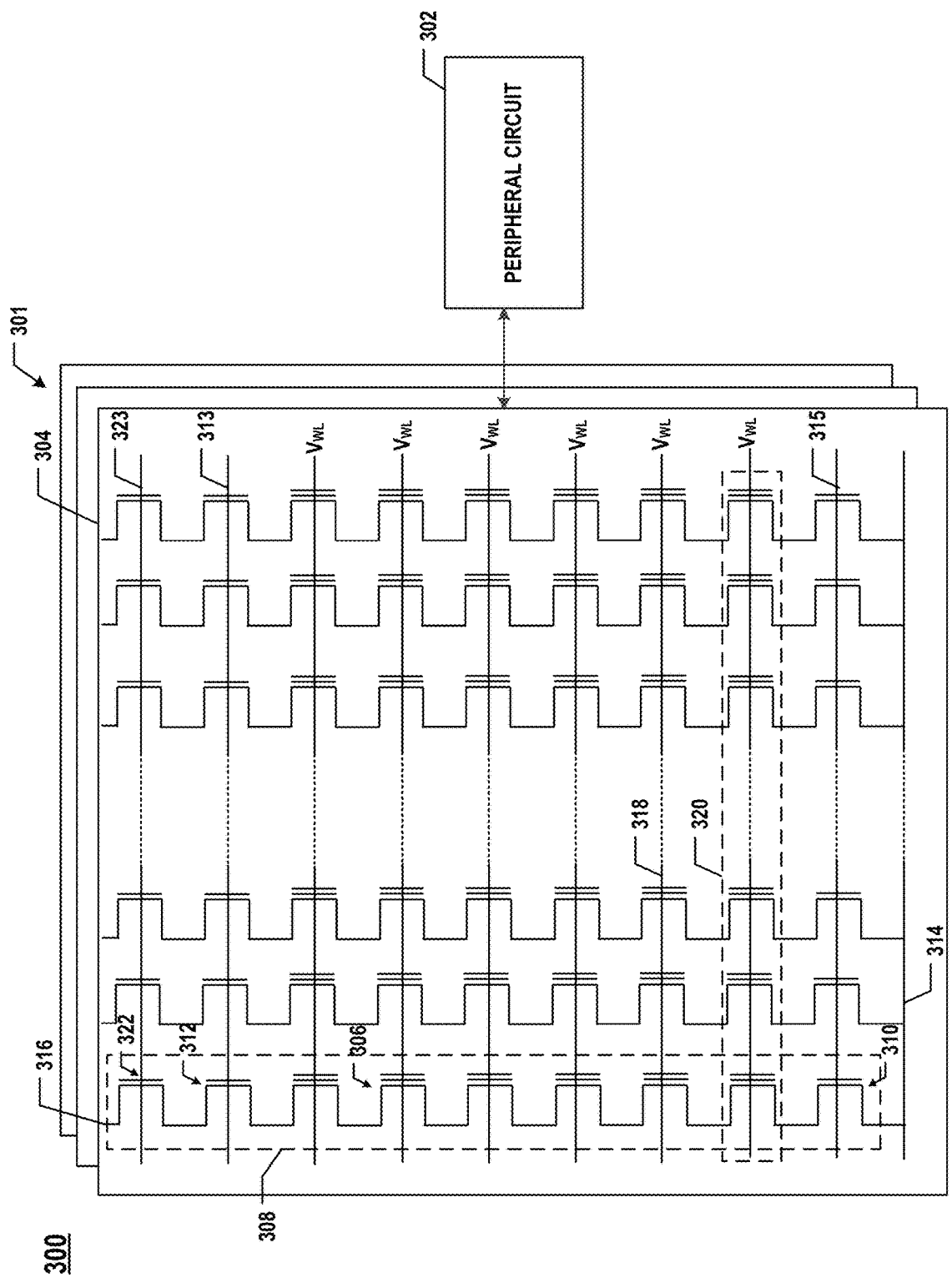
FIG. 3 illustrates a schematic diagram of an exemplary memory device including peripheral circuits, according to some aspects of the present disclosure.

FIG. 3 illustrates a schematic circuit diagram of an exemplary memory device 300 including peripheral circuits 302, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, which depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3, each NAND memory string 308 can also include a source select gate (SSG) transistor 310 at its source end and a drain select gate (DSG) transistor 312 at its drain end. SSG transistor 310 and DSG transistor 312 can be configured to activate selected NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (ASC), according to some implementations. The drain of each NAND memory string 308 is coupled to a respective bit line 316 from which data can be read or written via an output bus (not shown), according to some implementations. In some implementations, each NAND memory string 308 is configured to be selected or deselected by applying a select voltage or a deselect voltage to the gate of respective DSG transistor 312 through one or more DSG lines 313 and/or by applying a select voltage or a deselect voltage to the gate of respective SSG transistor 310 through one or more SSG lines 315.

As shown in FIG. 3, NAND memory strings 308 can be organized into multiple blocks 304, each of which can have a common source line 314, e.g., coupled to the ACS. In some implementations, each block 304 is the basic data unit for erase operations, i.e., all memory cells 306 on the same block 304 are erased at the same time. To erase memory cells 306 in a selected block 304, source lines 314 coupled to selected block 304 as well as unselected blocks 304 in the same plane as selected block 304 can be biased with an erase voltage (Vers), such as a high positive voltage (e.g., 20 V or more). Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program operations. The size of one page 320 in bits can relate to the number of NAND memory strings 308 coupled by word line 318 in one block 304. Each word line 318 can include a plurality of control gates (gate electrodes) at each memory cell 306 in respective page 320 and a gate line coupling the control gates.

Figure 4A:
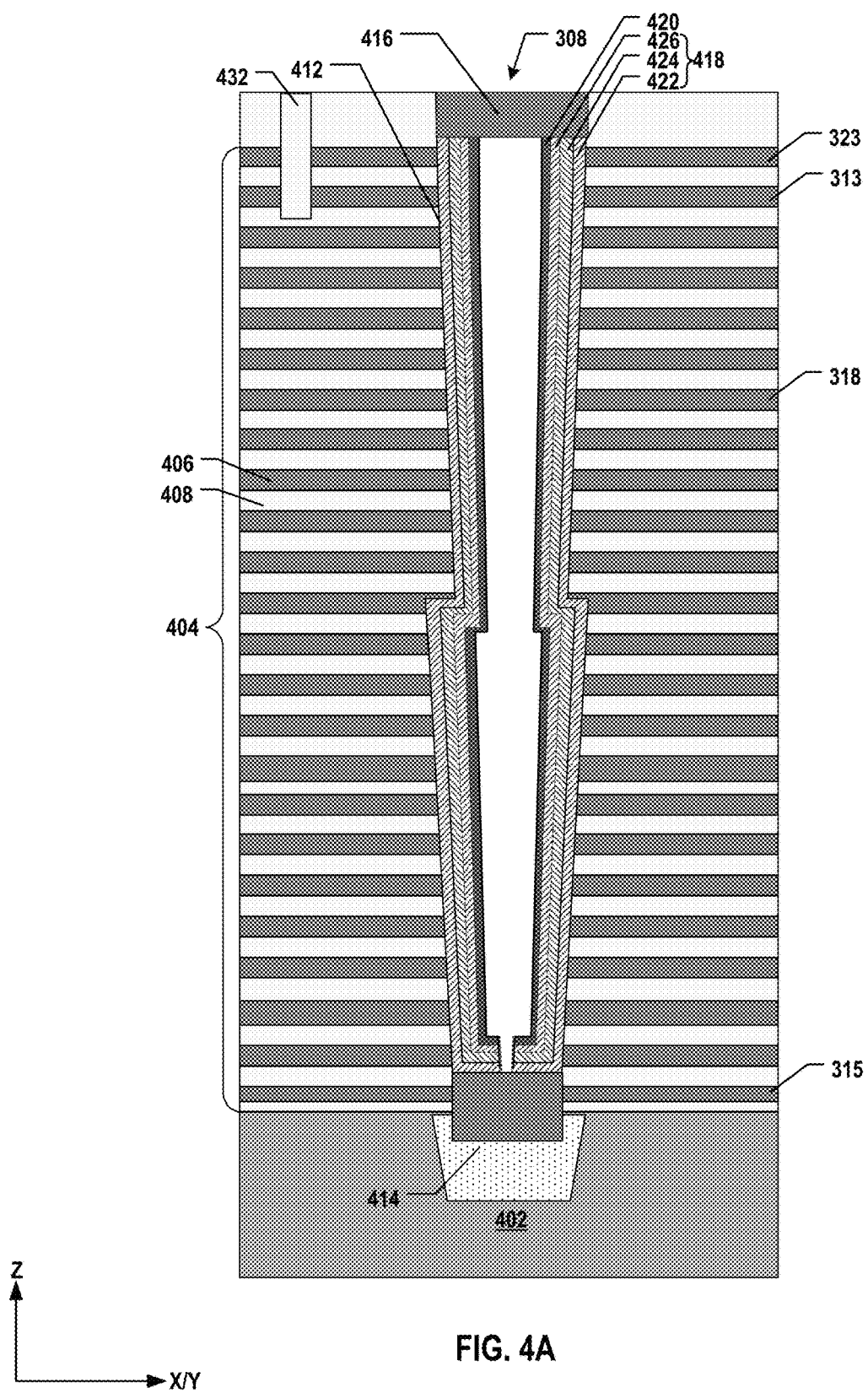
FIGS. 4A and 4B illustrate a side view and a plan view of cross-sections of an exemplary memory cell array including a NAND memory string, respectively, according to some aspects of the present disclosure.
Figure 4B:
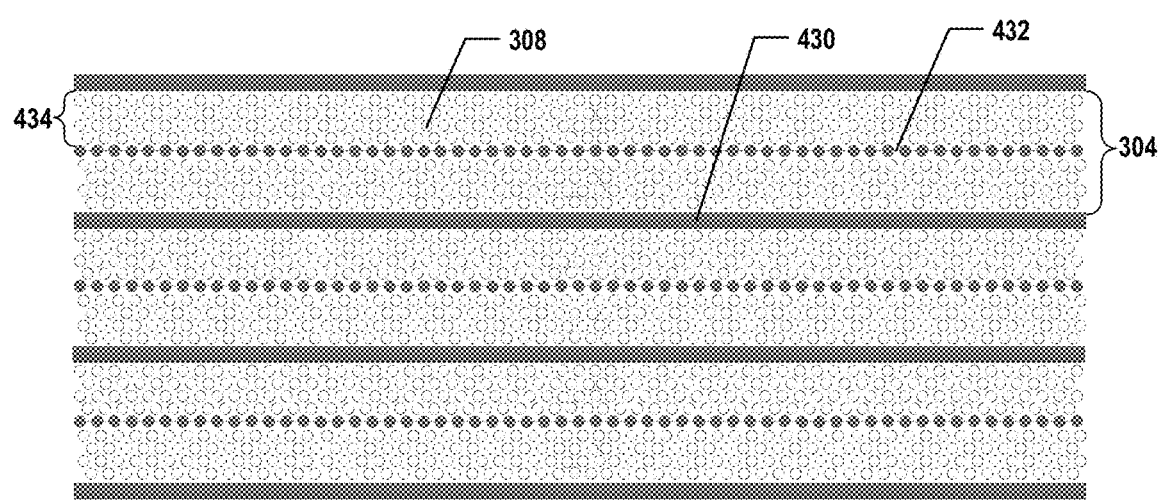
Figure 4B:
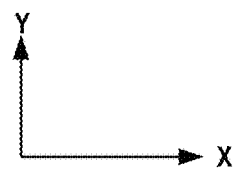

FIGS. 4A and 4B illustrate a side view and a plan view of cross-sections of an exemplary memory cell array 301 including NAND memory strings 308, respectively, according to some aspects of the present disclosure. As shown in FIG. 4A, NAND memory string 308 can extend vertically through a memory stack 404 above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials. It is noted that x, y, and z axes are included in FIG. 4A to further illustrate the spatial relationship of the components in a memory device. Substrate 402 includes two lateral surfaces extending laterally in the x-y plane: a top surface on the front side of the wafer on which the memory device can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the memory device is determined relative to substrate 402 of the memory device in the z-direction (the vertical direction perpendicular to the x-y plane) when substrate 402 is positioned in the lowest plane of the memory device in the z-direction. The same notion for describing the spatial relationships is applied throughout the present disclosure.

Memory stack 404 can include interleaved gate conductive layers 406 and gate-to-gate dielectric layers 408. The number of the pairs of gate conductive layers 406 and gate-to-gate dielectric layers 408 in memory stack 404 can determine the number of memory cells 306 in memory cell array 301. Gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include the control gates of memory cells 306, the gates of DSG transistors 312, or the gates of SSG transistors 310, and can extend laterally as DSG line 313 in the upper portion of memory stack 404, SSG line 315 in the lower portion of memory stack 404, or word line 318 between DSG line 313 and SSG line 315. It is understood that although one SSG line 315 and one DSG line 313 are shown in FIG. 4A, the number of SSG lines 315 and the number of DSG lines 313 (as well as the numbers of SSG transistors 310 and DSG transistors 312 coupled to the SSG lines 315 and DSG lines 313, respectively) may vary in other examples.

As described above, due to the nature of the fabrication process of forming interleaved gate conductive layers 406 and gate-to-gate dielectric layers 408 in memory stack 404, the transistors in NAND memory strings 308 coupled to the top gate conductive layer may have inferior electrical performance (e.g., the less steep subthreshold slope and temperature characteristics), compared with the transistors coupled to lower gate conductive layer 406. In some implementations, the electrical performance (e.g., the subthreshold slope and temperature characteristics) of the transistors in NAND memory strings 308 coupled to a lower gate conductive layer 406 is better than that of the transistors coupled to an upper gate conductive layer, such that the transistors coupled to the top gate conductive layer has the most inferior electrical performance. As described below in detail, consistent with the scope of the present disclosure, to reduce the impact of the inferior electrical performance, at least the top gate conductive layer does not include DSG line 313 or the gates of DSG transistors 312, but instead, includes a drain dummy line 323 and gates of drain dummy transistors 322, as shown in FIG. 3, according to some implementations. In other words, in some implementations, DSG line 313 and the gates of DSG transistors 312 are not parts of the top gate conductive layer. It is understood that in some examples, one or more gate conductive layers 406 below the top gate conductive layer (e.g., gate conductive layers 406 immediately below the top gate conductive layer) may also include a drain dummy line and gates of drain dummy transistors, like the top gate conductive layer.

As shown in FIG. 4A, NAND memory string 308 includes a channel structure 412 extending vertically through memory stack 404. In some implementations, channel structure 412 includes a channel hole filled with semiconductor material(s) (e.g., as a semiconductor channel 420) and dielectric material(s) (e.g., as a memory film 418). In some implementations, semiconductor channel 420 includes silicon, such as polysilicon. In some implementations, memory film 418 is a composite dielectric layer including a tunneling layer 426, a storage layer 424 (also known as a "charge trap/storage layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 may include a composite layer of silicon oxide/silicon oxynitride/silicon oxide (ONO).

As shown in FIG. 4A, a well 414 (e.g., a P-well and/or an N-well) is formed in substrate 402, and the source end of NAND memory string 308 is in contact with well 414, according to some implementations, according to some implementations. For example, source line 314 may be coupled to well 414 to apply an erase voltage to well 414, i.e., the source of NAND memory string 308, during erase operations. In some implementations, NAND memory string 308 further includes a channel plug 416 at the drain end of NAND memory string 308, e.g., as part of the drain of NAND memory string 308.

As shown in the plan view of FIG. 4B, NAND memory strings 308 of memory cell array 301 can be arranged into blocks 304 by slit structures 430 (e.g., gate line slits (GLSs)), which electrically separate word lines 318 between adjacent blocks 304, such that each block 304 can be individually controlled in read, program, and erase operations. In one example, each slit structure 430 may extend along the x-direction (e.g., the word line direction), and multiple blocks 304 may be arranged along the y-direction (e.g., the bit line direction). In some implementations, each block 304 can be further divided into smaller areas (e.g., fingers 434) by DSG cuts 432, which electrically separate DSG lines 313 between adjacent fingers 434, such that DSG lines 313 in different fingers 434 may be individually controlled in read and program operations. Also shown in FIGS. 3 and 4A, in some implementations, as drain dummy line 323 (part of the top gate conductive layer) is above DSG line 313, DSG cut 432 can also cut drain dummy line 323 into separate segments, e.g., multiple drain dummy lines 323 in multiple fingers 434, respectively. That is, similar to DSG lines 313, drain dummy lines 323 in different fingers 434 may be electrically separated by DSG cuts 432 and may be individually controlled in read and program operations.

Figure 5:
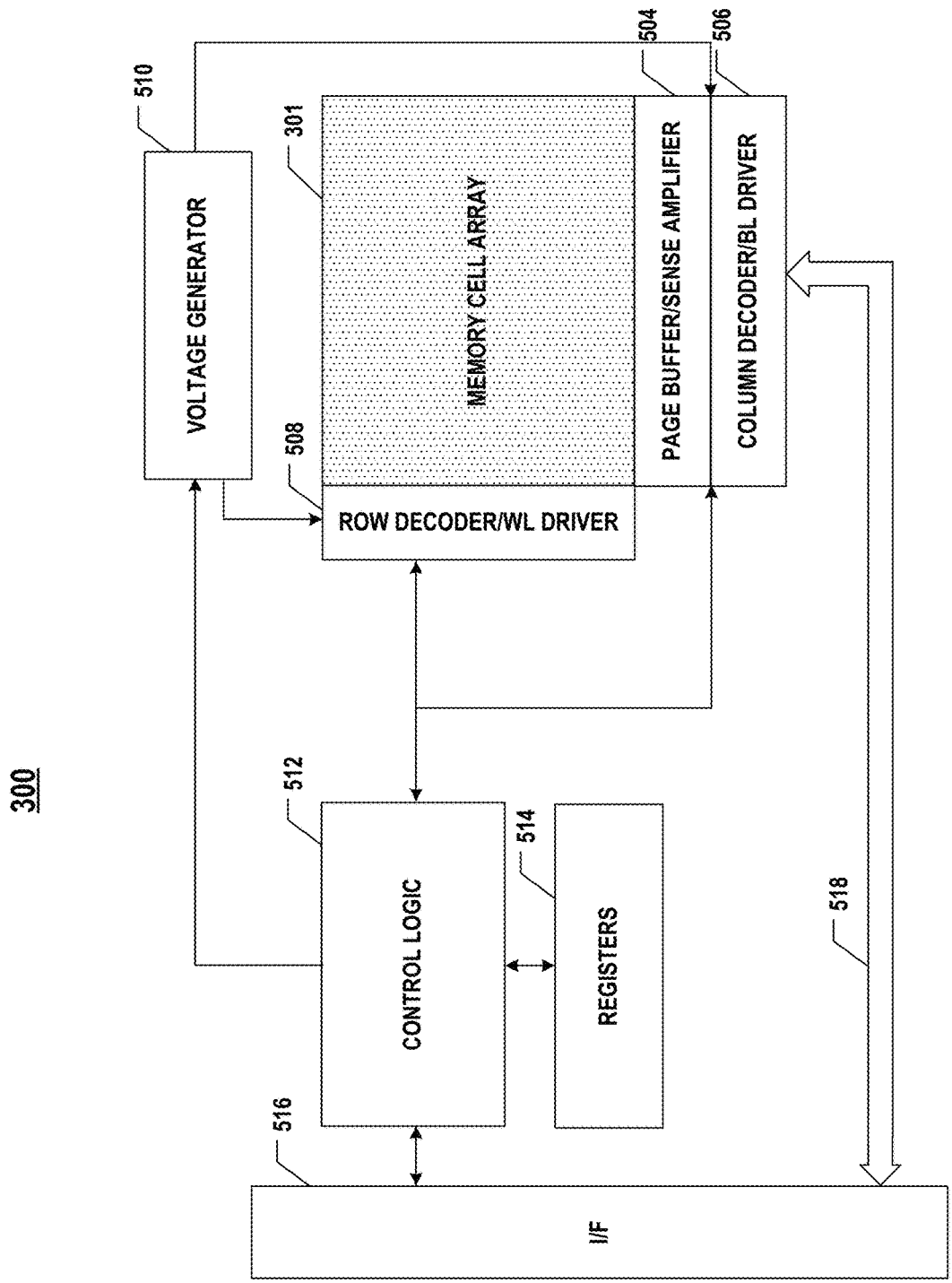
FIG. 5 illustrates a block diagram of an exemplary memory device including a memory cell array and peripheral circuits, according to some aspects of the present disclosure.

Referring back to FIG. 3, peripheral circuits 302 can be coupled to memory cell array 301 through bit lines 316, word lines 318, source lines 314, SSG lines 315, DSG lines 313, and drain dummy lines 323. Peripheral circuits 302 can include any suitable analog, digital, and mixed-signal circuits for facilitating the operations of memory cell array 301 by applying and sensing voltage signals and/or current signals to and from each target memory cell 306 through bit lines 316, word lines 318, source lines 314, SSG lines 315, DSG lines 313, and drain dummy lines 323. Peripheral circuits 302 can include various types of peripheral circuits formed using metal-oxide-semiconductor (MOS) technologies. For example, FIG. 5 illustrates some exemplary peripheral circuits including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5 may be included as well.

Page buffer/sense amplifier 504 can be configured to read and program (write) data from and to memory cell array 301 according to the control signals from control logic 512. In one example, page buffer/sense amplifier 504 may store one page of program data (write data) to be programmed into one page 320 of memory cell array 301. In another example, page buffer/sense amplifier 504 may perform program verify operations to ensure that the data has been properly programmed into memory cells 306 coupled to selected word lines 318. In still another example, page buffer/sense amplifier 504 may also sense the low power signals from bit line 316 that represents a data bit stored in memory cell 306 and amplify the small voltage swing to recognizable logic levels in a read operation. Column decoder/bit line driver 506 can be configured to be controlled by control logic 512 and select one or more NAND memory strings 308 by applying bit line voltages generated from voltage generator 510.

Row decoder/word line driver 508 can be configured to be controlled by control logic 512 and select/deselect blocks 304 of memory cell array 301 and select/deselect word lines 318 of block 304. Row decoder/word line driver 508 can be further configured to drive word lines 318 using word line voltages generated from voltage generator 510. In some implementations, row decoder/word line driver 508 can also select/deselect and drive SSG lines 315, DSG lines 313, and drain dummy lines 323 as well.

Voltage generator 510 can be configured to be controlled by control logic 512 and generate the word line voltages (e.g., read voltage, program voltage, channel pass voltage, local voltage, verification voltage, etc.), bit line voltages, and source line voltages to be supplied to memory cell array 301. As described below in detail, voltage generator 510 can also generate a drain dummy line voltage to be applied to drain dummy line 323 that are coupled to selected NAND memory strings 308, which is high enough to ensure that drain dummy transistors 322 can be fully turned on even at the low temperatures during program operations. For example, the drain dummy line voltage may be greater than the DSG voltage to be applied to DSG lines 313.

Control logic 512 can be coupled to each peripheral circuit described above and configured to control operations of each peripheral circuit. Registers 514 can be coupled to control logic 512 and include status registers, command registers, and address registers for storing status information, command operation codes (OP codes), and command addresses for controlling the operations of each peripheral circuit. Interface 516 can be coupled to control logic 512 and act as a control buffer to buffer and relay control commands received from a host (e.g., 108 in FIG. 1) to control logic 512 and status information received from control logic 512 to the host. Interface 516 can also be coupled to column decoder/bit line driver 506 via data bus 518 and act as a data input/output (I/O) interface and a data buffer to buffer and relay the data to and from memory cell array 301.

Figure 6:
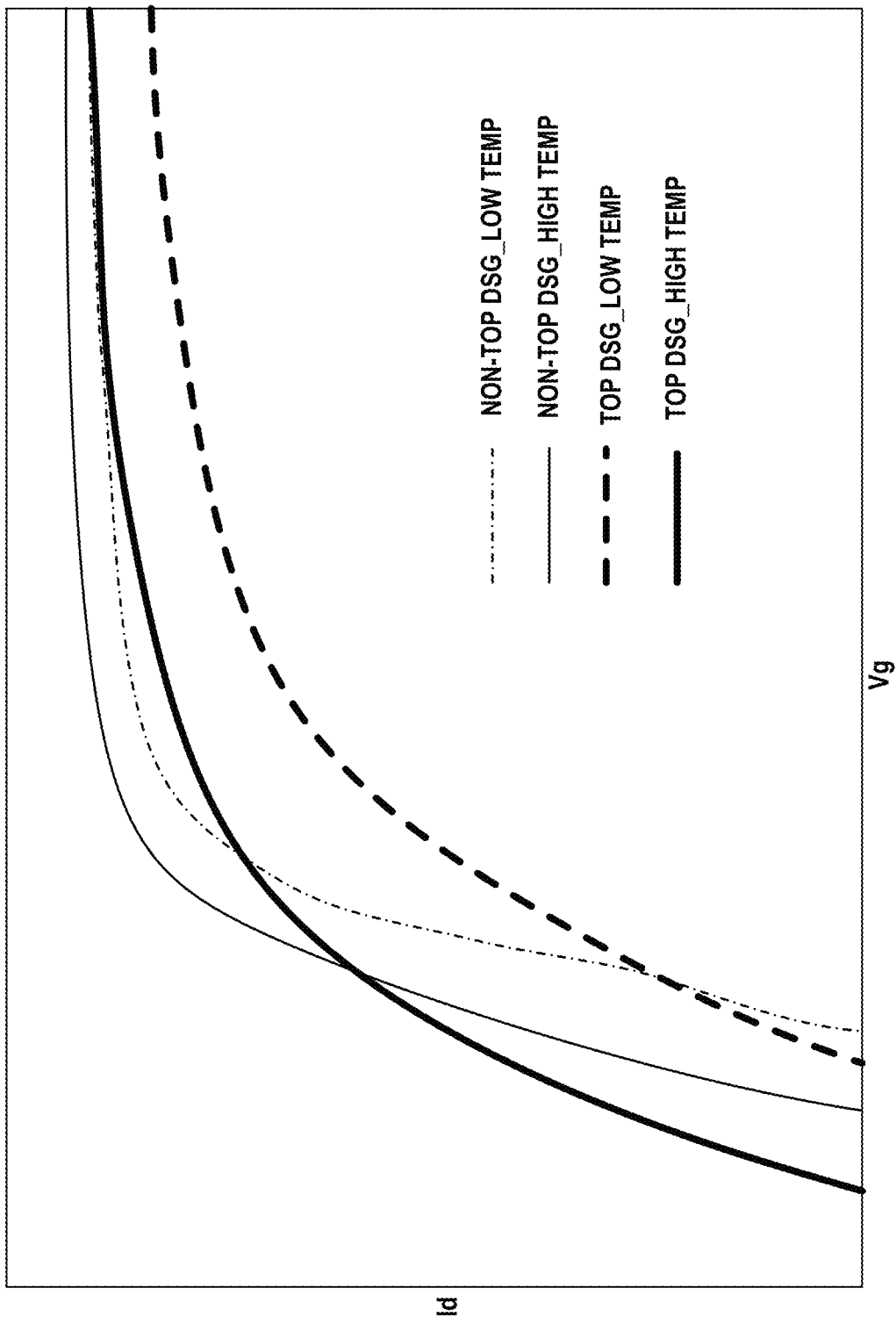
FIG. 6 illustrates subthreshold slopes of exemplary DSG transistors in different gate conductive layers and at different temperatures, according to some aspects of the present disclosure.

FIG. 6 illustrates subthreshold slopes of exemplary DSG transistors in different gate conductive layers and at different temperatures, according to some aspects of the present disclosure. The subthreshold slope is a feature of a metal-oxide-semiconductor field-effect transistor (MOSFET)'s drain current (Id)—gate voltage (Vg) characteristic. In the subthreshold region, the drain current behavior—though being controlled by the gate terminal—is similar to the exponentially decreasing current of a forward biased diode. Therefore, a plot of drain current versus gate voltage with drain, source, and bulk voltages fixed may exhibit approximately log linear behavior in this MOSFET operating regime. A device characterized by steep subthreshold slope exhibits a faster transition between off (low current) and on (high current) states. Its slope is the subthreshold slope. As shown in FIG. 6, at the same temperate, either a high temperature (e.g., at 45° C.) or a low temperature (e.g., at 0° C.), the DSG transistors formed in the non-top gate conductive layers of the memory stack (non-top DSG, e.g., DSG transistors 312 in FIG. 3) have a steeper subthreshold slope than the DSG transistors formed in the top gate conductive layer of the memory stack (top DSG, e.g., drain dummy transistors 322 in FIG. 3). Thus, the non-top DSG may exhibits a faster transition between off (low current) and on (high current) states than the top DSG. As a result, the leakage current from the top DSG may be higher than that from the non-top DSG, which can increase the program voltage disturbance in unselected NAND memory strings during program operations.

Moreover, as shown in FIG. 6, the threshold voltage (e.g., Vg@Id=0) of the top DSG more drastically increases as the temperature decreases, compared with that of the non-top DSG. Thus, the top DSG in a selected NAND memory string may not be fully turned on at the same DSG voltage when the operating temperature drops, thereby requiring a higher program voltage and/or more program voltage pulses, which may in turn increases both the program voltage disturbance in unselected NAND memory strings and channel pass voltage disturbance in selected NAND memory strings.

Figure 7:
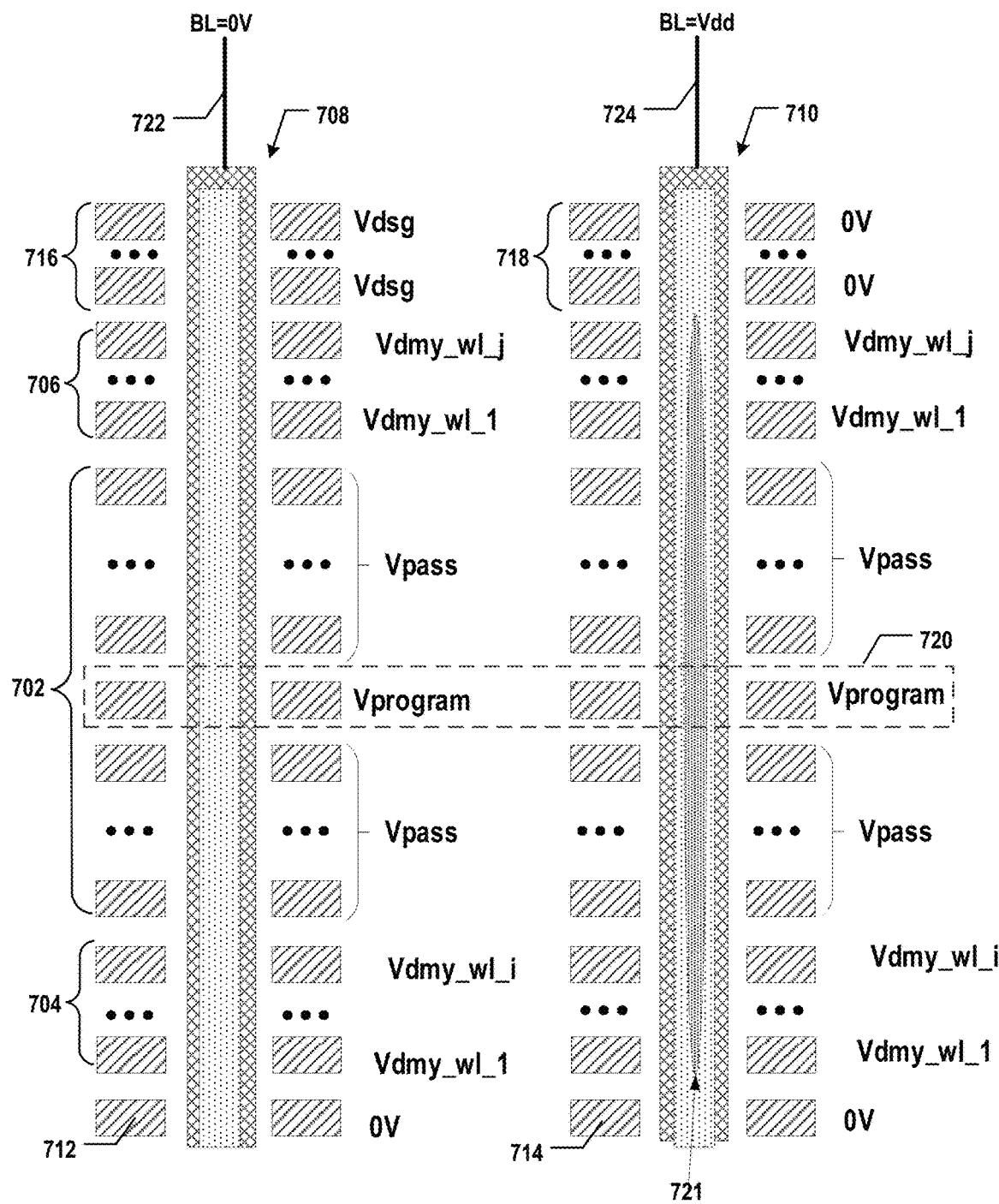
FIG. 7 illustrates a program operation scheme for 3D NAND memory strings.

For example, FIG. 7 illustrates a program operation scheme for 3D NAND memory strings. 3D NAND memory device 700 includes a plurality of gate conductive layers in the vertical direction acting as word lines. 3D NAND memory device 700 further includes a set of lower dummy word lines 704 below word lines 702 and a set of upper dummy word lines 706 above word lines 702. As shown in FIG. 7, 3D NAND memory device 700 also includes a plurality of NAND memory strings 708 and 710 each extending vertically through word lines 702 and dummy word lines 704 and 706. Each NAND memory string 708 or 710 includes memory cells coupled to word lines 702, respectively, as well as dummy memory cells coupled to dummy word lines 704 and 706, respectively.

As shown in FIG. 7, 3D NAND memory device 700 also include SSG lines 712 and 714 through which NAND memory strings 708 and 710 extend vertically, respectively. Similarly, 3D NAND memory device 700 further include DSG lines 716 and 718 through which NAND memory strings 708 and 710 extend vertically, respectively. Each NAND memory string 708 or 710 also includes a respective SSG transistor below lower dummy word lines 704 and coupled to SSG lines 712 and 714, respectively. Each NAND memory string 708 or 710 further includes a respective set of DSG transistors above upper dummy word lines 706 and coupled to DSG lines 716 and 718, respectively. 3D NAND memory device 700 also includes bit lines 722 and 724 respectively coupled to the drains of NAND memory strings 708 and 710. Thus, DSG lines 716 are between upper dummy word lines 706 and bit line 722, and DSG lines 718 are between upper dummy word lines 706 and bit line 724. That is, the DSG transistors coupled to DSG lines 716 and 718 in FIG. 7 include the top DSG as described above with respect to FIG. 6, which has inferior subthreshold slope and temperature characteristics than the non-top DSG.

During the program operation of 3D NAND memory device 700, a 0-V voltage is applied to both SSG lines 712 and 714 coupled to NAND memory string 708 and 710, respectively. A positive bias DSG voltage Vdsg is applied to DSG line 716 coupled to NAND memory string 708 to select NAND memory string 308, and a 0-V voltage is applied to DSG line 718 coupled to NAND memory string 710 to deselect NAND memory string 710. Each word line 702 is sequentially programmed by subsequently applying a program voltage Vprogram to each word line 702. For example, when programming memory cells coupled to a selected word line 720, the program voltage is applied to selected word line 720 to program the memory cell of selected NAND memory string 708 coupled to selected word line 720. When programming the memory cells coupled to selected word line 720, each of the rest of word lines 702 is applied with a channel pass voltage Vpass to open the channel (e.g., semiconductor channel 420 in FIG. 4A) of selected NAND memory string 308, which enables the memory cell in selected NAND memory string 708. Also, a set of dummy word line voltages are applied to each set of lower or upper dummy word lines 704 or 706. As shown in FIG. 7, a set of dummy word line voltages Vdmy_wl_1-Vdmy_wl_i are respectively applied to lower dummy word lines 704, and another set of dummy word line voltages Vdmy_wl_1-Vdmy_wl_j are respectively applied to upper dummy word lines 706.

During the program operation of 3D NAND memory device 700, for unselected NAND memory string 710, because the DSG transistors and SSG transistor at each end thereof are turned off, the channel of unselected NAND memory string 710 is floating. As each word line 702 is coupled to unselected NAND memory string 710 as well, the channel pass voltage applied to each of the rest of word lines 702 forms a channel coupling potential 721 in unselected NAND memory string 710 to suppress the programming of the memory cell in unselected NAND memory string 710 due to the program voltage applied to selected word line 720. Channel coupling potential 721 is formed by channel coupling effect in unselected NAND memory string 710, which is in a floating state, when the channel pass voltage is applied to the rest of word lines 702. To achieve the desired suppression effect on the program voltage applied to selected word line 720, the channel pass voltage needs to be large enough to generate channel coupling potential 721 that is comparable to the program voltage. However, for selected NAND memory string 708, the channel pass voltage applied to word line 702 that has already been programmed (e.g., each word line 702 below selected word line 720) may cause disturbance to the programmed memory cells if the channel pass voltage is too high, which is known as the "channel pass voltage disturbance" to selected NAND memory string 708. On the other hand, for unselected NAND memory string 710, if the program voltage is too high, channel coupling potential 721 may not effectively suppress the programming to the memory cell in unselected NAND memory string 710, which is known as the "program voltage disturbance" to unselected NAND memory string 710.

Because the DSG transistors of unselected NAND memory string 710 includes the top DSG described above with respect to FIG. 6, the relatively high leakage current from the top DSG due to its less steep subthreshold slope can increase the program voltage disturbance in unselected NAND memory string 710 during the program operations. Moreover, because the DSG transistors of selected NAND memory string 708 also includes the top DSG described above with respect to FIG. 6, the top DSG may not be fully turned on when the operating temperature drops, thereby requiring a higher program voltage and/or more program voltage pulses, which can in turn increases both the program voltage disturbance in unselected NAND memory string 710 and channel pass voltage disturbance in selected NAND memory string 708.

Figure 8A:
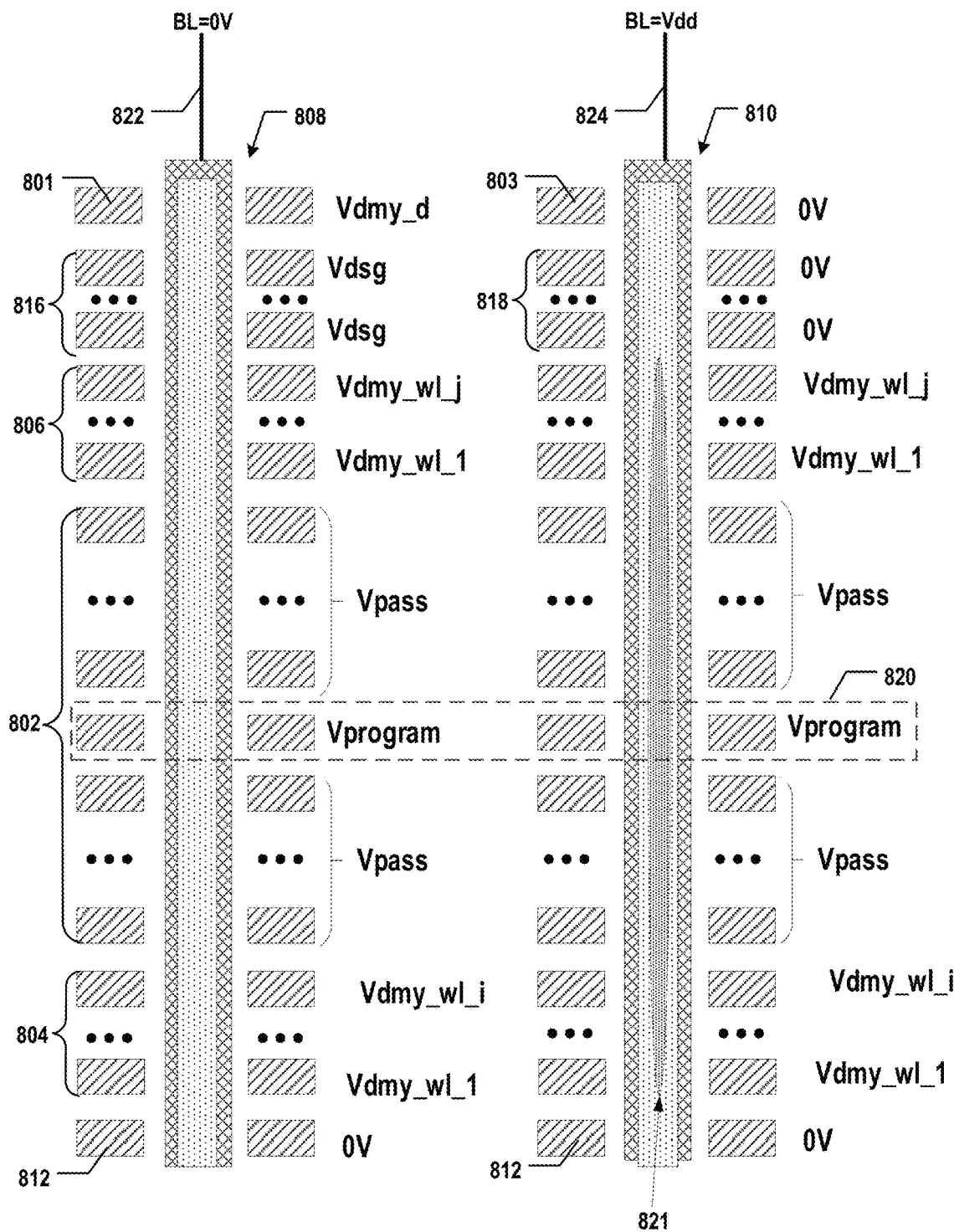
FIGS. 8A and 8B illustrate an exemplary program operation scheme for 3D NAND memory strings, according to some aspects of the present disclosure.
Figure 8B:
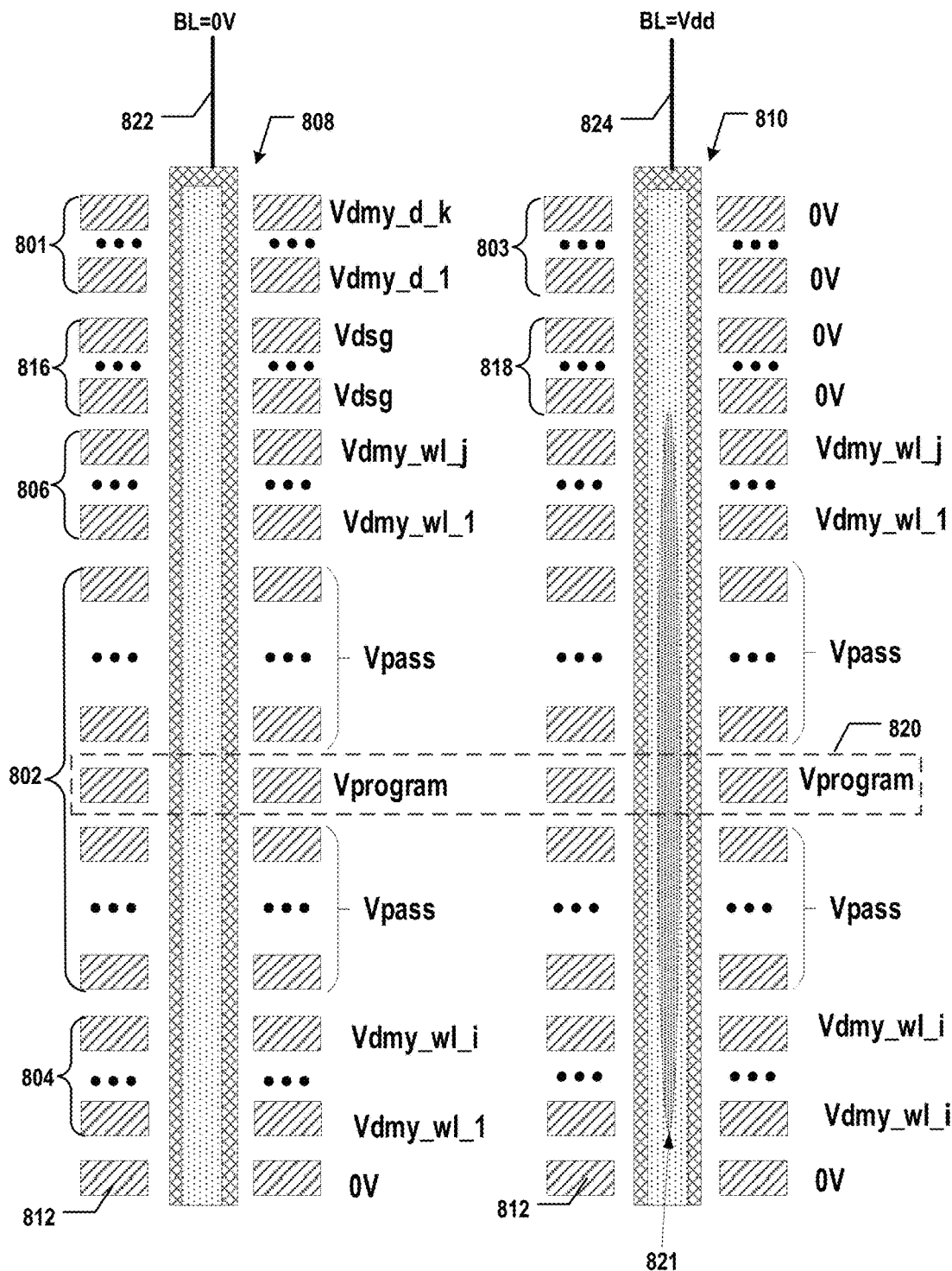
Figure 9:
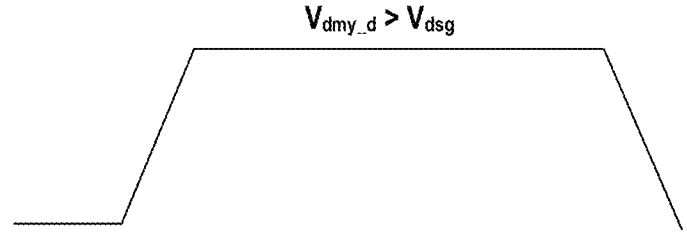
FIG. 9 illustrates a timing diagram of the exemplary program operation scheme in FIGS. 8A and 8B, according to some aspects of the present disclosure.
Figure 9:
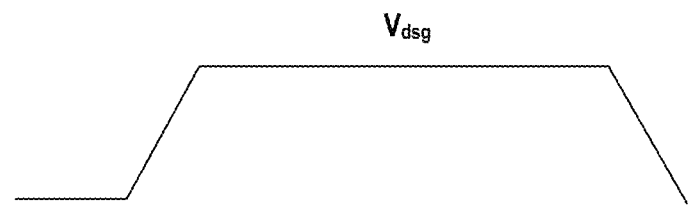
Figure 9:
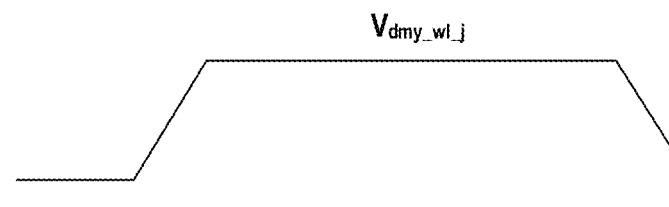
Figure 9:
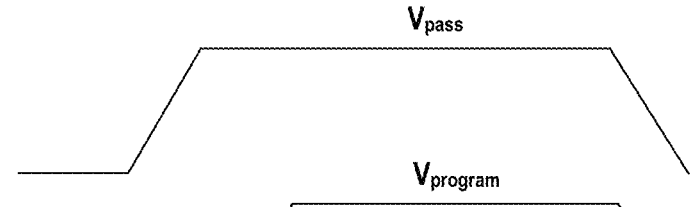
Figure 9:
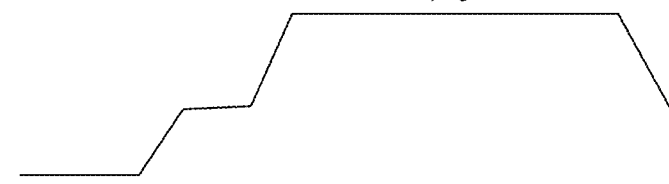

Consistent with the scope of the present disclosure, the top DSG can be avoided in both selected NAND memory strings and unselected NAND memory strings during the program operations to decrease the program voltage disturbance and channel pass voltage disturbance because of the inferior electrical performance of the top DSG. For example, FIGS. 8A and 8B illustrate an exemplary program operation scheme for 3D NAND memory strings, according to some aspects of the present disclosure. FIG. 9 illustrates a timing diagram of the exemplary program operation scheme in FIGS. 8A and 8B, according to some aspects of the present disclosure. A 3D NAND memory device 800 in FIGS. 8A and 8B may be an example of memory device 300 in FIGS. 3, 4A, 4B, and 5, which include NAND memory strings 808 and 810, which may be examples of NAND memory strings 308.

As shown in FIG. 8A, 3D NAND memory device 800 includes first NAND memory string 808 (a selected NAND memory string during program operations) and second NAND memory string 810 (an unselected NAND memory string during program operations), according to some implementations. 3D NAND memory device 800 can also include a first bit line 822 (a selected bit line during program operations) and a second bit line 824 (an unselected bit line during program operations) coupled to selected NAND memory string 808 and unselected NAND memory string 810, respectively. 3D NAND memory device 800 can further include word lines 802 and dummy word lines 804 and 806 each extending laterally and coupled to selected NAND memory string 808 and unselected NAND memory string 810. In some implementations, a set of lower dummy word lines 804 are below word lines 802 in the negative z-direction, i.e., towards the source ends of NAND memory strings

808 and 810. In some implementations, a set of upper dummy word lines 806 are above word lines 802 in the positive z-direction, i.e., towards the drain ends of NAND memory strings 808 and 810. 3D NAND memory device 800 can further include an SSG line 812 extending laterally and coupled to selected NAND memory string 808 and unselected NAND memory string 810. As shown in FIG. 8A, in some implementations, lower dummy word lines 804 are between SSG line 812 and word lines 802 in the vertical direction.

As shown in FIG. 8A, 3D NAND memory device 800 can further include a first set of DSG lines 816 (selected DSG lines during program operations) each coupled to selected NAND memory string 808, and a second set of DSG lines 818 (unselected DSG lines during program operations) each coupled to unselected NAND memory string 810. That is, different from SSG line 812 that is coupled to both selected and unselected NAND memory strings 808 and 810, DSG cuts (e.g., 432 in FIGS. 4A and 4B) can separate a DSG line into selected DSG line 816 and unselected DSG line 818 coupled to selected and unselected NAND memory strings 808 and 810, respectively, such that selected DSG line 816 and unselected DSG line 818 can be individually driven with different voltage signals during program operations.

Different from 3D NAND memory device 700 in FIG. 7, 3D NAND memory device 800 can further include a first drain dummy line 801 (selected drain dummy line during program operations) coupled to selected NAND memory string 808, and a second drain dummy line 803 (unselected drain dummy line during program operations) coupled to unselected NAND memory string 810. Similar to selected and unselected DSG lines 816 and 818, DSG cuts (e.g., 432 in FIGS. 4A and 4B) can separate a drain dummy line into selected drain dummy line 801 and unselected drain dummy line 803 coupled to selected and unselected NAND memory strings 808 and 810, respectively, such that selected drain dummy line 801 and unselected drain dummy line 803 can be individually driven with different voltage signals during program operations. In some implementations, selected drain dummy line 801 is between selected bit line 822 and selected DSG lines 816 in the vertical direction, and unselected drain dummy line 803 is between unselected bit line 824 and unselected DSG lines 818 in the vertical direction. As shown in FIG. 8A, DSG lines 816 and 818 are above upper dummy word lines 806 and word lines 802, and drain dummy lines 801 and 803 are above DSG lines 816 and 818, according to some implementations. It is noted that drain dummy lines 801 and 803 are different from upper dummy word lines 806 at least because (1) they have different relative positions with respect to DSG lines 816 and 818, i.e., drain dummy lines 801 and 803 are above DSG lines 816 and 818, while upper dummy word lines 806 are below DSG lines 816 and 818; and (2) selected drain dummy line 801 and unselected drain dummy line 803 are electrically separated and can be individually driven, while upper dummy word line 806 at the same level is a continuous line coupled to both selected and unselected NAND memory strings 808 and 810.

It is understood that the spatial relationships (e.g., above, below, upper, lower, top, bottom, etc.) described herein with respect to FIGS. 7, 8A, and 8B may use the substrate of 3D NAND memory device 700 or 800 as described above. Although the substrate of 3D NAND memory device 700 or 800 is not shown in FIGS. 7, 8A, and 8B, it is understood that the source ends of NAND memory strings 808 and 810 may be toward the substrate, while the drain ends of NAND memory strings 808 and 810 may be away from the substrate. In other words, the source and drain ends of NAND memory strings 808 and 810 may be used as the references in FIGS. 7, 8A, and 8B to show the spatial relationships (e.g., above, below, upper, lower, etc.). For example, drain dummy line 801 may be above DSG lines 816 when drain dummy line 801 is more toward the drain end (or more far away from the source end) of NAND memory string 808 than DSG lines 816, whereas upper dummy word lines 806 may be below DSG lines 816 when upper dummy word lines 806 are more toward the source end (or more far away from the drain end) of NAND memory string 808 than DSG lines 816.

In some implementations, from top to bottom (e.g., along the negative z-direction), selected NAND memory string 808 includes a drain (selected drain) coupled to selected bit line 822, a drain dummy transistor (selected drain dummy transistor) coupled to selected drain dummy line 801, DSG transistors (selected DSG transistors) respectively coupled to selected DSG lines 816, upper dummy memory cells respectively coupled to upper dummy word lines 806, memory cells respectively coupled to word lines 802, lower dummy memory cells respectively coupled to lower dummy word lines 804, an SSG transistor coupled to SSG line 812, and a source. Similarly, in some implementations, from top to bottom (e.g., along the negative z-direction), unselected NAND memory string 810 includes a drain (unselected drain) coupled to unselected bit line 824, a drain dummy transistor (unselected drain dummy transistor) coupled to unselected drain dummy line 803, DSG transistors (unselected DSG transistors) respectively coupled to unselected DSG lines 818, upper dummy memory cells respectively coupled to upper dummy word lines 806, memory cells respectively coupled to word lines 802, lower dummy memory cells respectively coupled to lower dummy word lines 804, an SSG transistor coupled to SSG line 812, and a source.

Different from NAND memory strings 708 and 710 in FIG. 7, selected NAND memory string 808 can further include the selected drain dummy transistor between the selected drain and the selected DSG transistor, and unselected NAND memory string 810 can further include the unselected drain dummy transistor between the unselected drain and the unselected DSG transistor. As described above with respect to FIGS. 3, 4A, 4B, and 6, the top DSG, which is in 3D NAND memory device 700 and has inferior electrical performance, can be avoided in 3D NAND memory device 800, i.e., being replaced by the drain dummy transistors coupled to drain dummy lines 801 and 803. In other words, each DSG transistor in 3D NAND memory device 700 is a non-top DSG, according to some implementations. It is understood that the number of DSG transistor in each NAND memory string 808 or 810 (the same as the number of drain dummy line 801 or 803) is not limited to "1," as shown in FIG. 8A. For example, as shown in FIG. 8B, 3D NAND memory device 800 may include a plurality selected drain dummy lines 801 coupled to selected NAND memory string 808 and a plurality of unselected drain dummy lines 803 coupled to unselected NAND memory string 810. That is, NAND memory string 808 or 810 may include more than one drain dummy transistors. Nevertheless, drain dummy transistors and drain dummy lines 801 and 803, as supposed to DSG transistors and DSG lines 816 and 816, are formed in the top conductive layer of the memory stack of 3D NAND memory device 800, according to some implementations.

Referring also to FIG. 5, the peripheral circuits can be configured to perform a program operation on a target memory cell of selected NAND memory string 808 coupled to a selected word line 820. To perform the program operation, column decoder/bit line driver 506 is configured to apply a select bit line voltage (e.g., 0-V, in FIG. 9) to selected bit line 822 and a deselect bit line voltage (e.g., a positive bias voltage, such as the system voltage Vdd) to unselected bit line 824, according to some implementations. To perform the program operation, row decoder/word line driver 508 is configured to apply an SSG voltage that is lower than the threshold voltage of the SSG transistors (e.g., 0-V, in FIG. 9) to SSG line 812 to turn off the SSG transistors of both selected and unselected NAND memory strings 808 and 810, according to some embodiments. Row decoder/word line driver 508 can be further configured to apply different DSG voltages to selected DSG lines 816 and unselected DSG lines 818 to turn on the selected DSG transistors of selected NAND memory string 808 and turn off the unselected DSG transistors of unselected NAND memory springs 810. For example, row decoder/word line driver 508 may apply a positive bias DSG voltage Vdsg (e.g., in FIG. 9) that is greater than the threshold voltage of the selected DSG transistors to selected DSG lines 816, and apply a 0-V voltage (or any other voltage below the threshold voltage of the unselected DSG transistors) to unselected DSG lines 818.

Different from the program operation scheme described above with respect to FIG. 7, as shown in FIGS. 8A and 8B, row decoder/word line driver 508 can be further configured to apply a drain dummy line voltage Vdmy_d (e.g., in FIG. 9) to selected drain dummy line(s) 801 to turn on the selected drain dummy transistor(s) coupled to selected drain dummy line(s) 801. To overcome the inferior electrical performance of the drain dummy transistors (top DSG), for example, the less steep subthreshold slope, a higher gate voltage can be applied to the selected drain dummy transistor than the selected DSG transistor to ensure that the selected drain dummy transistors is fully turned on with a minimum leakage current. In some implementations, the drain dummy line voltage Vdmy_d applied to selected drain dummy line 801 (and the gate of the selected drain dummy transistor) is greater than the DSG voltage Vdsg applied to selected DSG line 816 (and the gate of the selected DSG transistor). To overcome the inferior electrical performance of the drain dummy transistors (top DSG), for example, the worse temperature characteristics, a gate voltage applied to the selected drain dummy transistors can be greater than the threshold voltage of the selected drain dummy transistor at the lower bound of the operating temperate range of 3D NAND memory device 800 (i.e., the maximum threshold volage in the operating temperate range). In some implementations, the drain dummy line voltage applied to selected drain dummy line 801 (and the gate of the selected drain dummy transistor) is greater than the threshold voltage of the selected drain dummy transistor at −40° C. to ensure that the selected drain dummy transistors of selected NAND memory string 808 can be fully turned on at any operating temperature. In some implementations, the drain dummy line voltage Vdmy_d is between 6 V and 8 V.

In case that more than one drain dummy transistor and drain dummy line 801 are formed, as shown in FIG. 8B, row decoder/word line driver 508 can be configured to apply a set of drain dummy line voltages Vdmy_d_1 to Vdmy_d_k to drain drain dummy lines 801, respectively, to turn on each of the drain dummy transistors. Each of the drain dummy line voltages Vdmy_d_1 to Vdmy_d_k is greater than the DSG voltage Vdsg, according to some implementations. In some implementations, each of the drain dummy line voltages Vdmy_d_1 to Vdmy_d_k is greater than the threshold voltage of the respective drain dummy transistor at the lower bound (e.g., −40° C.) of the operating temperate range of 3D NAND memory device 800.

As to the unselected drain dummy transistor of unselected NAND memory string 810, similar to the unselected DSG transistors, row decoder/word line driver 508 can be configured to apply a 0-V voltage (or any other voltage below the threshold voltage of the unselected drain dummy transistor) to unselected drain dummy line 803 to turn off the unselected drain dummy transistor of unselected NAND memory string 810. As a result, the channel of unselected NAND memory string 810 can be turned off and floating during the program operation, and the channel of selected NAND memory string 808 can be turned on to allow programming on the target memory cell coupled to selected word line 820.

To perform the program operation, row decoder/word line driver 508 can be further configured to apply a program voltage Vprogram (e.g., a positive bias voltage, in FIG. 9) to selected word line 820 and a channel pass voltage Vpass (e.g., a positive bias voltage smaller than Vprogram, in FIG. 9) to each unselected word line 802. As a result, the target memory cell of selected NAND memory string 808 coupled to selected word line 820 can be programmed, while a channel coupling potential 821 can be formed in the channel of unselected NAND memory string 810 to suppress the programming to the memory cell of unselected NAND memory string 810 coupled to selected word line 820. In some implementations, row decoder/word line driver 508 is further configured to apply a set of lower dummy word line voltages Vdmy_wl_1 to Vdmy_wl_i to lower dummy word lines 804, respectively, and a set of upper dummy word line voltages Vdmy_wl_1 to Vdmy_wl_j (e.g., in FIG. 9) to upper dummy word lines 806, respectively. In some implementations, the upper dummy word line voltages Vdmy_wl_1 to Vdmy_wl_j are different from the drain dummy line voltage Vdmy_d. That is, different voltage signals can be applied to upper dummy word line 806 and drain dummy line 801.

Figure 10:
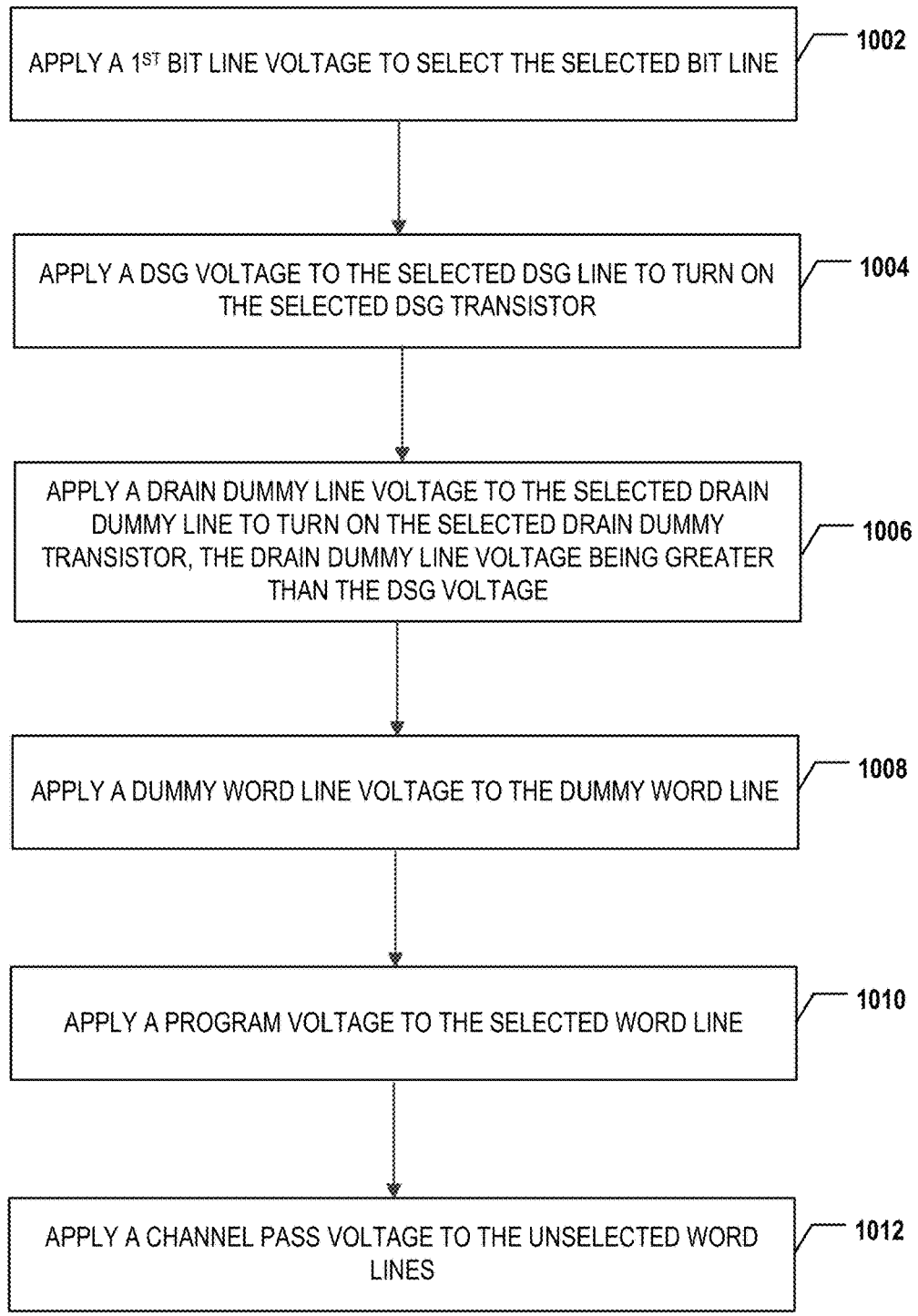
FIG. 10 illustrates a flowchart of a method for operating a memory device, according to some aspects of the present disclosure.

FIG. 10 illustrates a flowchart of a method 1000 for operating a memory device, according to some aspects of the present disclosure. The memory device may be any suitable memory device disclosed herein, such as memory devices 300 and 800. Method 1000 may be implemented by peripheral circuit 302, such as row decoder/word line driver 508 and column decoder/bit line driver 506. It is understood that the operations shown in method 1000 may not be exhaustive and that other operations can be performed as well before, after, or between any of the illustrated operations. Further, some of the operations may be performed simultaneously, or in a different order than shown in FIG. 10.

Referring to FIG. 10, method 1000 starts at operation 1002, in which a first bit line voltage (a select bit line voltage, e.g., 0-V) is applied to the selected bit line. In some implementations, a second bit line voltage (a deselect bit line voltage, e.g., a positive bias voltage) is applied to the unselected bit line. For example, in a program operation, column decoder/bit line driver 506 may apply a select bit line voltage (e.g., 0 V) to selected bit line 822 coupled to the drain of selected NAND memory string 808, and apply a deselect bit line voltage (e.g., Vdd) to unselected bit line 824 coupled to the drain of unselected NAND memory string 810.

Method 1000 proceeds to operation 1004, as illustrated in FIG. 10, in which a DSG voltage is applied to the selected DSG line to turn on the selected DSG transistor. In some implementations, a 0-V voltage (or any suitable voltage smaller than the threshold voltage of the DSG transistor) is applied to the unselected DSG line to turn off the unselected DSG transistor. For example, in the program operation, row decoder/word line driver 508 may apply a positive bias DSG voltage Vdsg greater than the threshold voltage of the DSG transistor to selected DSG line 816 coupled to the DSG transistor of selected NAND memory string 808, and apply a 0-V DSG voltage (or any suitable voltage smaller than the threshold voltage of the DSG transistor) to unselected DSG line 818 coupled to the DSG transistor of unselected NAND memory string 810.

Method 1000 proceeds to operation 1006, as illustrated in FIG. 10, in which a drain dummy line voltage is applied to the selected drain dummy line to turn on the selected drain dummy transistor. The drain dummy line voltage can be greater than the DSG voltage. In some implementations, the drain dummy line voltage is greater than the threshold voltage of the selected drain dummy transistor at the lower bound of the operating temperate range of the memory device (e.g., −40° C.). In some implementations, a 0-V voltage (or any suitable voltage smaller than the threshold voltage of the unselected drain dummy transistor) is applied to the unselected drain dummy line to turn off the unselected drain dummy transistor. For example, in the program operation, row decoder/word line driver 508 may apply a positive bias drain dummy voltage Vdmy_d greater than the DSG voltage Vdsg to selected drain dummy line 801 coupled to the drain dummy transistor of selected NAND memory string 808, and apply a 0-V DSG voltage (or any suitable voltage smaller than the threshold voltage of the drain dummy transistor) to unselected drain dummy line 803 coupled to the drain dummy transistor of unselected NAND memory string 810. In some implementations, the drain dummy line voltage Vdmy_d is between 6 V and 8 V.

Method 1000 proceeds to operation 1008, as illustrated in FIG. 10, in which a dummy word line voltage is applied to the dummy word line. The dummy word line voltage can be different from the drain dummy line voltage. For example, in the program operation, row decoder/word line driver 508 may apply a set of positive bias dummy word line voltages Vdmy_wl_1 to Vdmy_wl_j to upper dummy word lines 806 coupled to the dummy memory cells of both selected NAND memory string 808 and unselected NAND memory string 810. DSG lines 816 may be between upper dummy word lines 806 and drain dummy line 801.

Method 1000 proceeds to operation 1010, as illustrated in FIG. 10, in which a program voltage is applied to the selected word line to program the target memory cell coupled to the selected word line and the selected memory string. For example, in the program operation, row decoder/word line driver 508 may apply a positive bias program voltage Vprogram to selected word line 820 to program the target memory cell of selected NAND memory string 808.

Method 1000 proceeds to operation 1012, as illustrated in FIG. 10, in which a channel pass voltage is applied to the unselected word lines. The program voltage can be greater than the channel pass voltage. For example, in the program operation, row decoder/word line driver 508 may apply a positive bias channel pass voltage Vpass that is smaller than the program voltage Vprogram to each unselected word line 802.

According to one aspect of the present disclosure, a memory device includes a first memory string including a first drain, a first DSG transistor, first memory cells, and a first drain dummy transistor between the first drain and the first DSG transistor. The memory device also includes a first bit line coupled to the first drain, a first drain dummy line coupled to the first drain dummy transistor, a first DSG line coupled to the first DSG transistor, word lines respectively coupled to the first memory cells, and a peripheral circuit configured to perform a program operation on a target memory cell of the first memory cells coupled to a selected word line of the word lines. To perform the program operation, the peripheral circuit includes a bit line driver coupled to the first bit line and configured to apply a first bit line voltage to select the first bit line, and a word line driver coupled to the first drain dummy line and the first DSG line and configured to apply a DSG voltage to the first DSG line to turn on the first DSG transistor, and apply a drain dummy line voltage to the first drain dummy line to turn on the first drain dummy transistor. The drain dummy line voltage is greater than the DSG voltage.

In some implementations, the drain dummy line voltage is greater than a threshold voltage of the first drain dummy transistor at a lower bound of an operating temperate range of the memory device. In some implementations, the lower bound of the operating temperate range is −40° C.

In some implementations, the first memory string is a 3D NAND memory string, and the first DSG line is above the word lines, and the first drain dummy line is above the first DSG line.

In some implementations, the first memory cells include a dummy memory cell between the first DSG transistor and the target memory cell, the word lines include a dummy word line coupled to the dummy memory cell, and the word line driver is coupled to the dummy word line and further configured to apply a dummy word line voltage to the dummy word line. The dummy word line voltage can be different from the drain dummy line voltage.

In some implementations, to perform the program operation, the word line driver is coupled to the word lines and further configured to apply a program voltage to the selected word line, and apply a channel pass voltage to each of a rest of the word lines. The program voltage can be greater than the channel pass voltage.

In some implementations, the memory device further includes a second memory string including a second drain, a second DSG transistor, a plurality of second memory cells, and a second drain dummy transistor between the second drain and the second DSG transistor; a second bit line coupled to the second drain; a second drain dummy line coupled to the second drain dummy transistor, and a second DSG line coupled to the second DSG transistor. In some implementations, the plurality of word lines are respectively coupled to the second memory cells. In some implementations, to perform the program operation, the bit line driver is coupled to the second bit line and further configured to apply a second bit line voltage to deselect the second bit line, and the word line driver is coupled to the second DSG line and the second drain dummy line and further configured to apply a 0-V voltage to the second DSG line and the second drain dummy line.

In some implementations, the first and second DSG lines are electrically separated, and the first and second drain dummy lines are electrically separated.

According to another aspect of the present disclosure, a system includes a memory device configured to store data and a memory controller coupled to the memory device and configured to control the memory device. The memory device includes a first memory string including a first drain, a first DSG transistor, a plurality of first memory cells, and a first drain dummy transistor between the first drain and the first DSG transistor. The memory device also includes a first bit line coupled to the first drain, a first drain dummy line coupled to the first drain dummy transistor, a first DSG line coupled to the first DSG transistor, a plurality of word lines respectively coupled to the first memory cells, and a peripheral circuit configured to perform a program operation on a target memory cell of the first memory cells coupled to a selected word line of the word lines. To perform the program operation, the peripheral circuit includes a bit line driver coupled to the first bit line and configured to apply a first bit line voltage to select the first bit line, and a word line driver coupled to the first drain dummy line and the first DSG line and configured to apply a DSG voltage to the first DSG line to turn on the first DSG transistor, and apply a drain dummy line voltage to the first drain dummy line to turn on the first drain dummy transistor. The drain dummy line voltage is greater than the DSG voltage.

In some implementations, the system further includes a host coupled to the memory controller and configured to send or receive the data.

In some implementations, the drain dummy line voltage is greater than a threshold voltage of the first drain dummy transistor at a lower bound of an operating temperate range of the memory device. In some implementations, the lower bound of the operating temperate range is −40° C.

In some implementations, the first memory string is a 3D NAND memory string, and the first DSG line is above the word lines, and the first drain dummy line is above the first DSG line.

In some implementations, the first memory cells include a dummy memory cell between the first DSG transistor and the target memory cell, the word lines include a dummy word line coupled to the dummy memory cell, and the word line driver is coupled to the dummy word line and further configured to apply a dummy word line voltage to the dummy word line. The dummy word line voltage can be different from the drain dummy line voltage.

In some implementations, to perform the program operation, the word line driver is coupled to the word lines and further configured to apply a program voltage to the selected word line, and apply a channel pass voltage to each of a rest of the word lines. The program voltage can be greater than the channel pass voltage.

In some implementations, the memory device further includes a second memory string including a second drain, a second DSG transistor, a plurality of second memory cells, and a second drain dummy transistor between the second drain and the second DSG transistor; a second bit line coupled to the second drain; a second drain dummy line coupled to the second drain dummy transistor, and a second DSG line coupled to the second DSG transistor. In some implementations, the plurality of word lines are respectively coupled to the second memory cells. In some implementations, to perform the program operation, the bit line driver is coupled to the second bit line and further configured to apply a second bit line voltage to deselect the second bit line, and the word line driver is coupled to the second DSG line and the second drain dummy line and further configured to apply a 0-V voltage to the second DSG line and the second drain dummy line.

In some implementations, the first and second DSG lines are electrically separated, and the first and second drain dummy lines are electrically separated.

According to still another aspect of the present disclosure, a method for operating a memory device is provided. The memory device includes a first memory string including a first drain, a first DSG transistor, a plurality of first memory cells, and a first drain dummy transistor between the first drain and the first DSG transistor; a first bit line coupled to the first drain; a first drain dummy line coupled to the first drain dummy transistor; a first DSG line coupled to the first DSG transistor; and a plurality of word lines respectively coupled to the first memory cells. A program operation is performed on a target memory cell of the first memory cells coupled to a selected word line of the word lines. To perform the program operation, a first bit line voltage is applied to select the first bit line, a DSG voltage is applied to the first DSG line to turn on the first DSG transistor, and a drain dummy line voltage is applied to the first drain dummy line to turn on the first drain dummy transistor. The drain dummy line voltage is greater than the DSG voltage.

In some implementations, the drain dummy line voltage is greater than a threshold voltage of the first drain dummy transistor at a lower bound of an operating temperate range of the memory device. In some implementations, the lower bound of the operating temperate range is −40° C.

In some implementations, the first memory string is a 3D NAND memory string, and the first DSG line is above the word lines, and the first drain dummy line is above the first DSG line.

In some implementations, the first memory cells include a dummy memory cell between the first DSG transistor and the target memory cell, and the word lines include a dummy word line coupled to the dummy memory cell. In some implementations, to perform the program operation, a dummy word line voltage is applied to the dummy word line. The dummy word line voltage can be different from the drain dummy line voltage.

In some implementations, to perform the program operation, a program voltage is applied to the selected word line, and a channel pass voltage is applied to each of a rest of the word lines. The program voltage can be greater than the channel pass voltage.

In some implementations, the memory device further includes a second memory string including a second drain, a second DSG transistor, a plurality of second memory cells, and a second drain dummy transistor between the second drain and the second DSG transistor; a second bit line coupled to the second drain; a second drain dummy line coupled to the second drain dummy transistor, and a second DSG line coupled to the second DSG transistor. In some implementations, the plurality of word lines are respectively coupled to the second memory cells. In some implementations, to perform the program operation, a second bit line voltage is applied to deselect the second bit line, and a 0-V voltage is applied to the second DSG line and the second drain dummy line.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:
1. A memory device, comprising:
a first memory string comprising a first drain, a first drain select gate (DSG) transistor, a first drain dummy transistor between the first drain and the first DSG transistor, and a plurality of first memory cells, a first drain dummy line being coupled to the first drain dummy transistor, and a first DSG line being coupled to the first DSG transistor; and
a peripheral circuit configured to, in a program operation:
apply a first DSG voltage to the first DSG line;
apply a first drain dummy line voltage to the first drain dummy line to turn on the first drain dummy transistor, the first drain dummy line voltage being greater than the first DSG voltage;
apply a program voltage to a target main word line coupled to a target memory cell of the first memory cells; and
apply a pass voltage to each of unselected main word lines coupled to a respective one of remaining first main memory cells of the first memory cells, the first DSG transistor being arranged between the target memory cell and the first drain dummy transistor.

2. The memory device of claim 1, wherein:
the first drain dummy line voltage is configured to turn on the first drain dummy transistor at a lower bound of an operating temperature range of the first drain dummy transistor.

3. The memory device of claim 2, wherein:
the lower bound of the operating temperature range is approximately −40° C.

4. The memory device of claim 1, wherein the first DSG voltage is configured to turn on the first DSG transistor.

5. The memory device of claim 1, further comprising:
a second memory string comprising a second drain, a second DSG transistor, a second drain dummy transistor between the second drain and the second DSG transistor, and a plurality of second memory cells, a second drain dummy line being coupled to the second drain dummy transistor, and a second DSG line being coupled to the second DSG transistor,
wherein:
the peripheral circuit is further configured to, in the program operation:
apply a second DSG voltage to the second DSG line to turn off the second DSG transistor; and
apply a second drain dummy line voltage to the second drain dummy line to turn off the second drain dummy transistor.

6. The memory device of claim 5, further comprising:
a DSG cut configured to electrically separate the first DSG line and the second DSG line in adjacent memory zones of the memory device.

7. The memory device of claim 5, wherein the peripheral circuit is further configured to, in the program operation:
apply a first bit line voltage to a first bit line coupled to the first memory string; and
apply a second bit line voltage to a second bit line coupled to the second memory string, the first bit line voltage being different from the second bit line voltage.

8. The memory device of claim 1, wherein:
the plurality of first memory cells comprise a plurality of first main memory cells; and
the first DSG transistor is arranged between the first drain dummy transistor and the plurality of first main memory cells.

9. The memory device of claim 8, wherein:
the plurality of first memory cells further comprise a first upper dummy memory cell; and
the peripheral circuit is further configured to, in the program operation:
apply a first dummy word line voltage to a first dummy word line coupled to the first upper dummy memory cell, the first dummy word line voltage being different from the first drain dummy line voltage.

10. The memory device of claim 8, wherein:
the plurality of first memory cells further comprise a first upper dummy memory cell and a first lower dummy memory cell; and
the plurality of first main memory cells are arranged between the first upper dummy memory cell and the first lower dummy memory cell.

11. The memory device of claim 1, further comprising:
a second memory string comprising a plurality of second main memory cells,
wherein:
the target main word line is coupled to one second main memory cell of the second main memory cells; and
each of the unselected main word lines is coupled to one of remaining second main memory cells of the plurality of second main memory cells.

12. The memory device of claim 1, wherein:
the first memory string further comprises a third drain dummy transistor arranged between the first drain dummy transistor and the first DSG transistor, a third drain dummy line being coupled to the third drain dummy transistor; and
the peripheral circuit is further configured to, in the program operation:
apply a third drain dummy line voltage to the third drain dummy line to turn on the third drain dummy transistor, the third drain dummy line voltage being greater than the first DSG voltage.

13. A system, comprising:
a memory device, comprising:
a first memory string comprising a first drain, a first drain select gate (DSG) transistor, a first drain dummy transistor between the first drain and the first DSG transistor, and a plurality of first memory cells, a first drain dummy line being coupled to the first drain dummy transistor, and a first DSG line being coupled to the first DSG transistor; and
a peripheral circuit configured to, in a program operation:
apply a first DSG voltage to the first DSG line;
apply a first drain dummy line voltage to the first drain dummy line to turn on the first drain dummy transistor, the first drain dummy line voltage being greater than the first DSG voltage;
apply a program voltage to a target main word line coupled to a target memory cell of the first memory cells; and
apply a pass voltage to each of unselected main word lines coupled to a respective one of remaining first main memory cells of the first memory cells, the first DSG transistor being arranged between the target memory cell and the first drain dummy transistor; and
a memory controller coupled to the memory device and configured to control the memory device.

14. The system of claim 13, further comprising:
a host coupled to the memory controller and configured to receive or send data to the memory controller.

15. The system of claim 13, wherein:
the first drain dummy line voltage is configured to turn on the first drain dummy transistor at a lower bound of an operating temperature range of the first drain dummy transistor.

16. The system of claim 13, wherein:
the memory device further comprises:
  a second memory string comprising a second drain, a second DSG transistor, a second drain dummy transistor between the second drain and the second DSG transistor, and a plurality of second memory cells, a second drain dummy line being coupled to the second drain dummy transistor, and a second DSG line being coupled to the second DSG transistor, wherein:
  the peripheral circuit is further configured to, in the program operation:
    apply a second DSG voltage to the second DSG line to turn off the second DSG transistor; and
    apply a second drain dummy line voltage to the second drain dummy line to turn off the second drain dummy transistor.

17. A method for operating a memory device, comprising:
performing a program operation on the memory device that comprises a first memory string comprising a first drain, a first drain select gate (DSG) transistor, a first drain dummy transistor between the first drain and the first DSG transistor, and a plurality of first memory cells, a first drain dummy line being coupled to the first drain dummy transistor, and a first DSG line being coupled to the first DSG transistor, the program operation comprising:
  applying a first DSG voltage to the first DSG line; and
  applying a first drain dummy line voltage to the first drain dummy line to turn on the first drain dummy transistor, the first drain dummy line voltage being greater than the first DSG voltage,
wherein:
the first memory string further comprises a third drain dummy transistor arranged between the first drain dummy transistor and the first DSG transistor, a third drain dummy line being coupled to the third drain dummy transistor; and
the program operation further comprises:
  applying a third drain dummy line voltage to the third drain dummy line to turn on the third drain dummy transistor, the third drain dummy line voltage being greater than the first DSG voltage.

18. The method of claim 17, wherein:
the first drain dummy line voltage is configured to turn on the first drain dummy transistor at a lower bound of an operating temperature range of the first drain dummy transistor.

19. The method of claim 17, wherein:
the memory device further comprises:
  a second memory string comprising a second drain, a second DSG transistor, a second drain dummy transistor between the second drain and the second DSG transistor, and a plurality of second memory cells, a second drain dummy line being coupled to the second drain dummy transistor, and a second DSG line being coupled to the second DSG transistor; and
the method further comprises:
  applying a second DSG voltage to the second DSG line to turn off the second DSG transistor; and
  applying a second drain dummy line voltage to the second drain dummy line to turn off the second drain dummy transistor.

20. The memory device of claim 1, wherein
at the lower bound of an operating temperature range of the first drain dummy transistor, the first drain dummy transistor in the first memory string corresponds to a threshold voltage; and
the first drain dummy line voltage is greater than the threshold voltage.

* * * * *